(12) United States Patent
Shi et al.

(10) Patent No.: US 10,475,823 B2
(45) Date of Patent: Nov. 12, 2019

(54) METHOD FOR MANUFACTURING TFT SUBSTRATE AND STRUCTURE THEREOF

(71) Applicant: Shenzhen China Star Optoelectronics Technology Co., Ltd., Shenzhen (CN)

(72) Inventors: Longqiang Shi, Shenzhen (CN); Baixiang Han, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 15/960,564

(22) Filed: Apr. 24, 2018

(65) Prior Publication Data
US 2018/0240818 A1    Aug. 23, 2018

Related U.S. Application Data

(62) Division of application No. 14/759,190, filed on Jul. 2, 2015, now Pat. No. 9,978,778.

(30) Foreign Application Priority Data

May 6, 2015    (CN) .......................... 2015 1 0227686

(51) Int. Cl.
| | |
|---|---|
| H01L 27/12 | (2006.01) |
| H01L 21/02 | (2006.01) |
| H01L 21/443 | (2006.01) |
| H01L 29/24 | (2006.01) |
| H01L 29/49 | (2006.01) |
| H01L 29/786 | (2006.01) |
| G09G 3/3225 | (2016.01) |

(52) U.S. Cl.
CPC ...... *H01L 27/124* (2013.01); *H01L 21/02565* (2013.01); *H01L 21/02631* (2013.01); *H01L 21/443* (2013.01); *H01L 27/127* (2013.01); *H01L 27/1225* (2013.01); *H01L 29/24* (2013.01); *H01L 29/4908* (2013.01); *H01L 29/7869* (2013.01); *H01L 29/78648* (2013.01); *G09G 3/3225* (2013.01); *G09G 2300/043* (2013.01); *G09G 2300/0465* (2013.01)

(58) Field of Classification Search
None
See application file for complete search history.

(56) References Cited

U.S. PATENT DOCUMENTS

| | | | | |
|---|---|---|---|---|
| 2005/0127371 A1* | 6/2005 | Yamazaki | ........... | H01L 27/3244 257/72 |
| 2013/0062607 A1* | 3/2013 | Yamazaki | ........... | H01L 27/1225 257/59 |

* cited by examiner

*Primary Examiner* — Raj R Gupta
(74) *Attorney, Agent, or Firm* — Leong C. Lei

(57) ABSTRACT

The present invention provides a method for manufacturing a TFT substrate and a structure thereof. The method for manufacturing the TFT substrate arranges a connection electrode (83) that connects two dual gate TFTs in a third metal layer to prevent the design rules of a connection electrode and a second metal layer of the prior art techniques from being narrowed due to the connection electrode being collectively present on the second metal layer with signal lines of a data line and a voltage supply line so as to facilitate increase of an aperture ratio and definition of a display panel. The present invention provides a TFT substrate structure, which has a simple structure and possesses a high aperture ratio and high definition.

7 Claims, 7 Drawing Sheets

METHOD FOR MANUFACTURING TFT SUBSTRATE AND STRUCTURE THEREOF

CROSS REFERENCE TO RELATED APPLICATIONS

This is a divisional application of co-pending U.S. patent application Ser. No. 14/759,190, which is a national stage of PCT Application No. PCT/CN2015/079907, filed on May 27, 2015, claiming foreign priority of Chinese Patent Application No. 201510227686.2, filed on May 6, 2015.

BACKGROUND OF THE INVENTION

1. Field of the Invention

The present invention relates to the field of displaying technology, and in particular to a method for manufacturing a thin-film transistor (TFT) substrate and a structure thereof.

2. The Related Arts

In the field of displaying technology, flat panel display technology, such as liquid crystal displays (LCDs) and organic light-emitting diodes (OLEDs), has gradually taken the place of cathode ray tube (CRT) displays, and among them, the OLEDs have various advantages, such as being self-luminous, low driving voltage, high light emission efficiency, short response time, high clarity and contrast, virtually 180° view angle, wide temperature range of applications, being capable of flexible displaying, and full color displaying in a large area, and are considered a display device with the best potential of development.

The OLEDs can be classified, according to the type of driving, as passive OLEDs (such as passive matrix OLEDs (PMOLEDs)) and active OLEDs (such as active matrix OLEDs (AMOLEDs)). An AMOLED device is driven by electrical current and thus has a severe requirement for the electrical current of thin-film transistors. Thus, an AMOLED product must comprise a pixel compensation circuit to reduce current variation resulting from instability of TFT in the entire driving process. Dual gate TFTs have excellent electrical stability and have been widely used in circuit driving.

A conventional AMOLED pixel compensation circuit often involves multiple TFT connected in series. For example, FIG. 1 illustrates a dual gate TFT pixel compensation circuit, which comprises two dual gate TFTs, namely TFT1 and TFT2, connected in series between two signal lines that are a data line $V_{data}$ and a voltage supply line $V_{dd}$. FIG. 2 illustrates a TFT substrate structure corresponding to the dual gate TFT pixel compensation circuit shown in FIG. 1. FIG. 3 is a schematic view illustrating the arrangement and connection of the TFT components of the TFT substrate structure shown in FIG. 2 with the data line and the voltage supply line.

As shown in FIGS. 2 and 3, the TFT substrate structure comprises, in sequence from bottom to top, a substrate 100, a first metal layer, a gate insulation layer 300, a semiconductor layer, an etch stop layer 500, a second metal layer, a passivation layer 700, and a third metal layer. The first metal layer comprises a first bottom gate terminal 210 and a second bottom gate terminal 230 that are spaced from each other. The semiconductor layer comprises a first semiconductor 420 and a second semiconductor 440 that are spaced from each other. The second metal layer comprises a first source terminal 610, a connection electrode 620, and a second drain terminal 630 that are spaced from each other. The third metal layer comprises a first top gate terminal 820 and a second top gate terminal 840 that are spaced from each other.

The etch stop layer 500 comprises a first through hole 510, a second through hole 520, a third through hole 530, and a fourth through hole 540 formed therein. The first source terminal 610 is set in contact with an end of the first semiconductor 420 via the first through hole 510. The connection electrode 620 is set in contact with an opposite end of the first semiconductor 420 via the second through hole 520 and is also set in contact with an end of the second semiconductor 440 via the third through hole 530. The second drain terminal 630 is set in contact with an opposite end of the second semiconductor 440 via the fourth through hole 540.

The first bottom gate terminal 210, the first semiconductor 420, the first source terminal 610, the connection electrode 620, and the first top gate terminal 820 collectively form a first dual gate TFT; and the second bottom gate terminal 230, the second semiconductor 440, the connection electrode 620, the second drain terminal 630, and the second top gate terminal 840 collectively form a second dual gate TFT.

As shown in FIGS. 2 and 3, the connection electrode 620 simultaneously serves as a first drain terminal for the first dual gate TFT and a second source terminal for the second dual gate TFT so as to seriously connect the first dual gate TFT and the second dual gate TFT. However, the second metal layer on which the connection electrode 620 is located also comprises signal lines, such as the data line $V_{data}$ and the voltage supply line $V_{dd}$, the design rule for the connection electrode 620 is very narrow and in addition, the bridging between the two dual gate TFTs through the connection electrode 620 would further narrow the design rule of the second metal layer and thus making it adverse to the manufacture of a display panel with a high aperture ratio and high definition.

SUMMARY OF THE INVENTION

An object of the present invention is to provide a method for manufacturing a thin-film transistor (TFT) substrate, which arranges a connection electrode that connects between two dual gate TFTs in a third metal layer so as to prevent the design rules of the connection electrode and the second metal layer of the prior art techniques from being narrowed due to the connection electrode being collectively present on the second metal layer with signal lines of a data line and a voltage supply line thereby facilitating the manufacture of a display panel having a high aperture ratio and high definition.

An object of the present invention is also to provide a TFT substrate structure, which has a simple structure and has a high aperture ratio and high definition.

To achieve the above objects, firstly, the present invention provides a method for manufacturing a TFT substrate, which comprises the following steps:

(1) providing a substrate, depositing a first metal layer on the substrate, and applying a photolithographic process to patternize the first metal layer so as to form a first bottom gate terminal and a second bottom gate terminal that are spaced from each other;

(2) depositing a gate insulation layer on the first bottom gate terminal, the second bottom gate terminal, and the substrate;

(3) depositing a metal oxide layer on the gate insulation layer and applying a photolithographic process to patternize the metal oxide layer to form a first semiconductor layer and a second semiconductor layer that are spaced from each other, wherein the first semiconductor layer comprises a first channel zone and a first source contact zone and a first drain contact zone respectively located on opposite sides of the first channel zone and the second semiconductor layer comprises a second channel zone and a second source contact zone and a second drain contact zone respectively located on opposite sides of the second channel zone;

(4) depositing an etch stop layer on the first semiconductor layer, the second semiconductor layer, and the gate insulation layer and applying a photolithographic process to form a first through hole and a second through hole in the etch stop layer to respectively expose the first source contact zone and the second drain contact zone;

(5) depositing a second metal layer on the etch stop layer and applying a photolithographic process to patternize the second metal layer to form a first source terminal and a second drain terminal that are spaced from each other, wherein the first source terminal is set in contact with the first source contact zone via the first through hole and the second drain terminal is set in contact with the second drain contact zone via the second through hole;

(6) depositing a passivation layer on the first source terminal, the second drain terminal, and the etch stop layer and applying a photolithographic process to form a third through hole and a fourth through hole in the passivation layer and the etch stop layer to respectively expose the first drain contact zone and the second source contact zone; and (7) depositing a third metal layer on the passivation layer and applying a photolithographic process to patternize the third metal layer to form a first top gate terminal, a connection electrode, and a second top gate terminal that are spaced from each other, wherein the connection electrode is set in contact with the first drain contact zone and the second source contact zone via the third through hole and the fourth through hole.

Step (1) uses physical vapor deposition to deposit the first metal layer, the first metal layer comprising a material of copper, aluminum, or molybdenum, the photolithographic process of step (1) comprising operations of photoresist application, exposure, development, wet etching, and photoresist removal; and step (2) uses plasma enhanced chemical vapor deposition to deposit the gate insulation layer, the gate insulation layer comprising a material of silicon oxide or silicon nitride.

Step (3) uses physical vapor deposition to deposit the metal oxide layer, the metal oxide layer comprising a material of IGZO, the photolithographic process of step (3) comprising operations of photoresist application, exposure, development, wet etching, and photoresist removal.

Step (4) uses chemical vapor deposition to deposit the etch stop layer, the etch stop layer comprising a material of silicon oxide or silicon nitride, the photolithographic process of step (4) comprising operations of photoresist application, exposure, development, dry etching, and photoresist removal; and step (5) uses physical vapor deposition to deposit the second metal layer, the second metal layer comprising a material of copper, aluminum, or molybdenum, the photolithographic process of step (5) comprising operations of photoresist application, exposure, development, wet etching, and photoresist removal.

Step (6) uses chemical vapor deposition to deposit the passivation layer, the passivation layer comprising a material of silicon oxide or silicon nitride, the photolithographic process of step (6) comprising operations of photoresist application, exposure, development, dry etching, and photoresist removal; and step (7) uses physical vapor deposition to deposit the third metal layer, the third metal layer comprising a material of copper, aluminum, or molybdenum, the photolithographic process of step (7) comprising operations of photoresist application, exposure, development, wet etching, and photoresist removal.

The present invention also provides a TFT substrate structure, which comprises, in sequence from bottom to top, a substrate, a first metal layer, a gate insulation layer, a semiconductor layer, an etch stop layer, a second metal layer, a passivation layer, and a third metal layer, the first metal layer comprising a first bottom gate terminal and a second bottom gate terminal that are spaced from each other, the semiconductor layer comprising a first semiconductor layer and a second semiconductor layer that are spaced from each other, the second metal layer comprising a first source terminal and a second drain terminal that are spaced from each other, the third metal layer comprising a first top gate terminal, a connection electrode, and a second top gate terminal that are spaced from each other;

wherein the etch stop layer comprises a first through hole and a second through hole formed therein, the passivation layer and the etch stop layer comprising a third through hole and a fourth through hole formed therein, the first source terminal being set in contact with an end of the first semiconductor layer via the first through hole, the connection electrode being set in contact with an opposite end of the first semiconductor layer via the third through hole and also in contact with an end of the second semiconductor layer via the fourth through hole, the second drain terminal being set in contact with an opposite end of the second semiconductor layer via the second through hole; and wherein the first bottom gate terminal, the first semiconductor layer, the first source terminal, the connection electrode, and the first top gate terminal constitute a first dual gate TFT; and the second bottom gate terminal, the second semiconductor layer, the connection electrode, the second drain terminal, and the second top gate terminal constitute a second dual gate TFT, the connection electrode serving as both a first drain terminal of the first dual gate TFT and a second source terminal of the second dual gate TFT so as to have the first dual gate TFT and the second dual gate connected in series with each other.

The first semiconductor layer comprises a first channel zone and a first source contact zone and a first drain contact zone that are respectively located on opposite sides of the first channel zone; and the second semiconductor layer comprises a second channel zone and a second source contact zone and a second drain contact zone that are respectively located on opposite sides of the second channel zone.

The first through hole, the third through hole, the fourth through hole, and the second through hole respectively expose the first source contact zone, the first drain contact zone, the second source contact zone, and the second drain contact zone.

The first source terminal is set in contact with the first source contact zone via the first through hole, the connection electrode being set in contact with the first drain contact zone and the second source contact zone respectively through the third through hole and the fourth through hole, the second drain terminal being set in contact with the second drain contact zone via the second through hole.

The semiconductor layer comprises a material of metal oxides.

The present invention further provides a TFT substrate structure, which comprises, in sequence from bottom to top, a substrate, a first metal layer, a gate insulation layer, a semiconductor layer, an etch stop layer, a second metal layer, a passivation layer, and a third metal layer, the first metal layer comprising a first bottom gate terminal and a second bottom gate terminal that are spaced from each other, the semiconductor layer comprising a first semiconductor layer and a second semiconductor layer that are spaced from each other, the second metal layer comprising a first source terminal and a second drain terminal that are spaced from each other, the third metal layer comprising a first top gate terminal, a connection electrode, and a second top gate terminal that are spaced from each other;

wherein the etch stop layer comprises a first through hole and a second through hole formed therein, the passivation layer and the etch stop layer comprising a third through hole and a fourth through hole formed therein, the first source terminal being set in contact with an end of the first semiconductor layer via the first through hole, the connection electrode being set in contact with an opposite end of the first semiconductor layer via the third through hole and also in contact with an end of the second semiconductor layer via the fourth through hole, the second drain terminal being set in contact with an opposite end of the second semiconductor layer via the second through hole;

wherein the first bottom gate terminal, the first semiconductor layer, the first source terminal, the connection electrode, and the first top gate terminal constitute a first dual gate TFT; and the second bottom gate terminal, the second semiconductor layer, the connection electrode, the second drain terminal, and the second top gate terminal constitute a second dual gate TFT, the connection electrode serving as both a first drain terminal of the first dual gate TFT and a second source terminal of the second dual gate TFT so as to have the first dual gate TFT and the second dual gate connected in series with each other;

wherein the first semiconductor layer comprises a first channel zone and a first source contact zone and a first drain contact zone that are respectively located on opposite sides of the first channel zone; and the second semiconductor layer comprises a second channel zone and a second source contact zone and a second drain contact zone that are respectively located on opposite sides of the second channel zone;

wherein the first through hole, the third through hole, the fourth through hole, and the second through hole respectively expose the first source contact zone, the first drain contact zone, the second source contact zone, and the second drain contact zone; and wherein the semiconductor layer comprises a material of metal oxides.

The efficacy of the present invention is that the present invention provides a method for manufacturing a TFT substrate, which arranges a connection electrode that connects two dual gate TFTs in a third metal layer to prevent the design rules of a connection electrode and a second metal layer of the prior art techniques from being narrowed due to the connection electrode being collectively present on the second metal layer with signal lines of a data line and a voltage supply line so as to facilitate increase of an aperture ratio and definition of a display panel. The present invention provides a TFT substrate structure, which has a simple structure and possesses a high aperture ratio and high definition.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of an embodiment of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
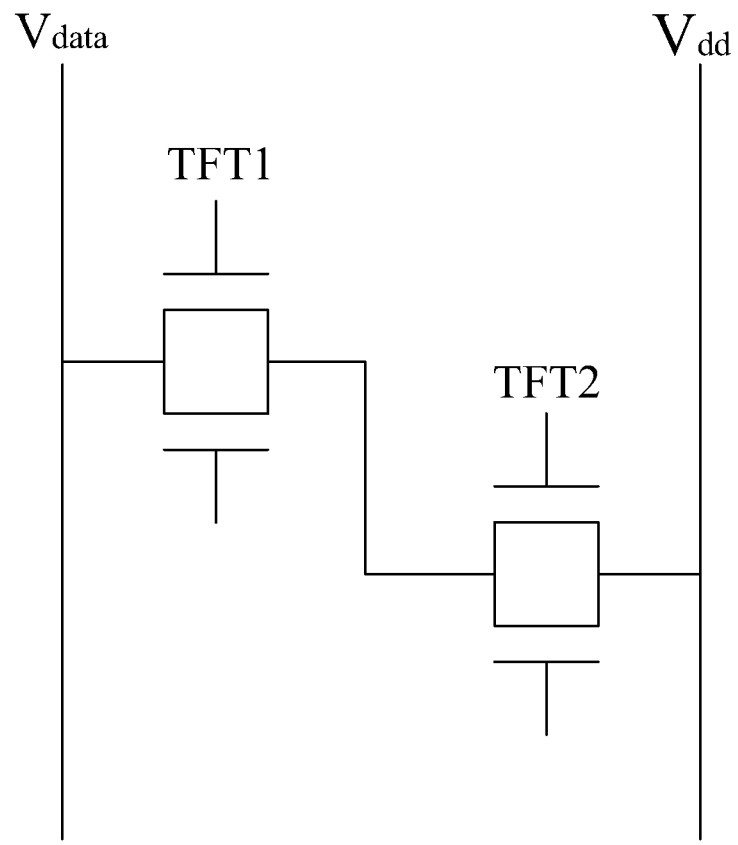
FIG. 1 is a circuit diagram of a conventional dual gate thin-film transistor (TFT) pixel compensation circuit.
Figure 2:
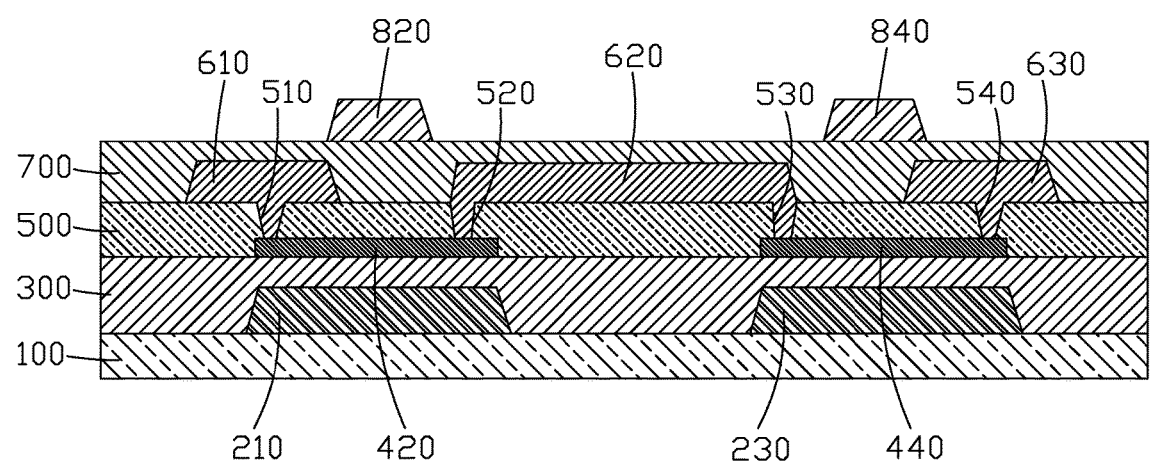
FIG. 2 is a schematic view showing a TFT substrate structure corresponding to the dual gate TFT pixel compensation circuit of FIG. 1.
Figure 3:
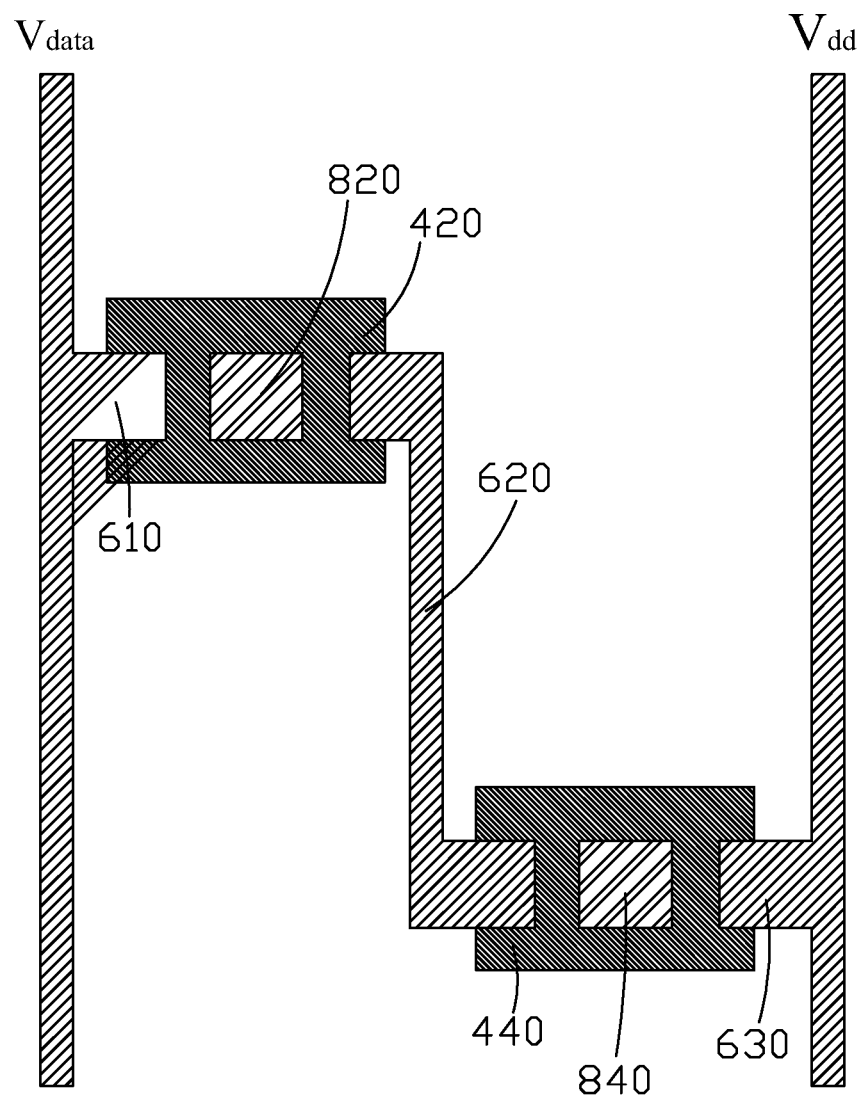
FIG. 3 is a schematic view illustrating the arrangement and connection of TFT components of the TFT substrate structure of FIG. 2 with a data line and a voltage supply line.
Figure 4:
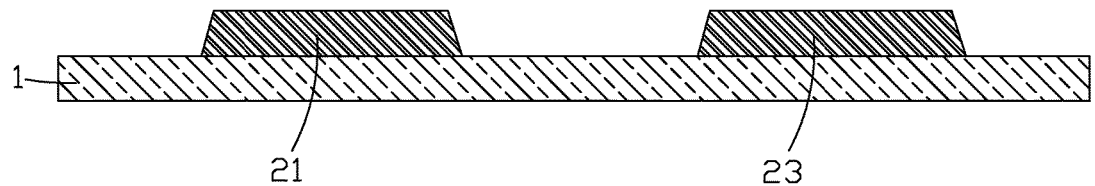
FIG. 4 is a schematic view illustrating a first step of a method for manufacturing a TFT substrate according to the present invention.

Referring to FIGS. 4-11, the present invention provides a method for manufacturing a thin-film transistor (TFT) substrate, which comprises the following steps:

Step 1: as shown in FIG. 4, providing a substrate 1, depositing a first metal layer on the substrate 1, and applying a photolithographic process to patternize the first metal layer so as to form a first bottom gate terminal 21 and a bottom second gate terminal 23 that are spaced from each other.

Preferably, the substrate 1 is a glass substrate.

Specifically, step 1 uses physical vapor deposition (PVD) to deposit the first metal layer. Preferably, the first metal layer comprises a material of copper, aluminum, or molybdenum.

The photolithographic process comprises operations of photoresist application, exposure, development, wet etching, and photoresist removal.

Figure 5:
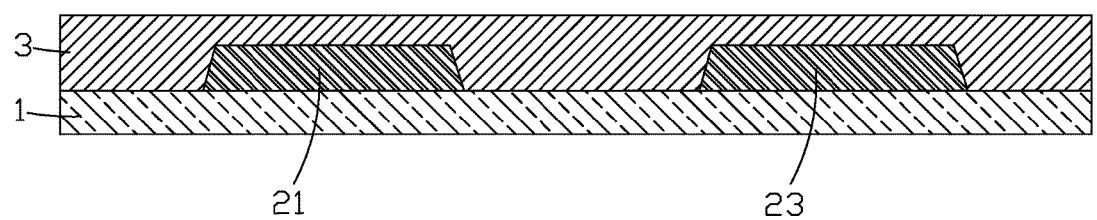
FIG. 5 is a schematic view illustrating a second step of the method for manufacturing the TFT substrate according to the present invention.

Step 2: as shown in FIG. 5, depositing a gate insulation layer 3 on the first bottom gate terminal 21, the second bottom gate terminal 23, and the substrate 1.

Specifically, step 2 uses plasma enhanced chemical vapor deposition (PECVD) to deposit the gate insulation layer 3. Preferably, the gate insulation layer 3 comprises a material of silicon oxide or silicon nitride.

Figure 6:
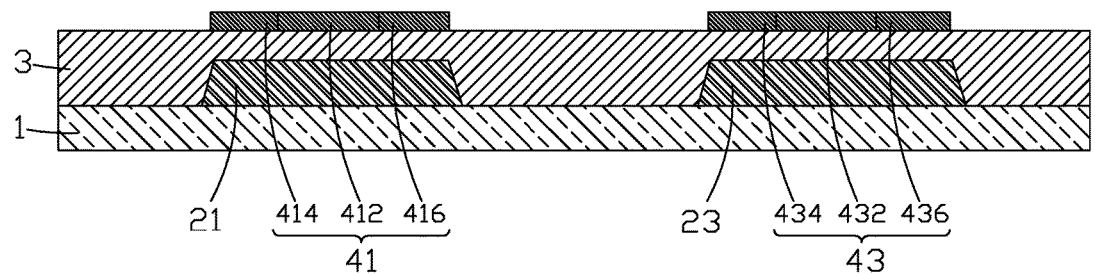
FIG. 6 is a schematic view illustrating a third step of the method for manufacturing the TFT substrate according to the present invention

Step 3: as shown in FIG. 6, depositing a metal oxide layer on the gate insulation layer 3 and applying a photolithographic process to patternize the metal oxide layer so as to form first semiconductor layer 41 and a second semiconductor layer 43 that are spaced from each other.

The first semiconductor layer 41 comprises a first channel zone 412 and a first source contact zone 414 and a first drain contact zone 416 that are respectively located on opposite sides of the first channel zone 412. The second semiconductor layer 43 comprises a second channel zone 432 and a second source contact zone 434 and a second drain contact zone 436 that are respectively located on opposite sides of the second channel zone 432.

Specifically, step 3 uses PVD to deposit the metal oxide layer. Preferably, the metal oxide layer comprises a material of indium gallium zinc oxide (IGZO).

The photolithographic process comprises operations of photoresist application, exposure, development, wet etching, and photoresist removal.

Figure 7:
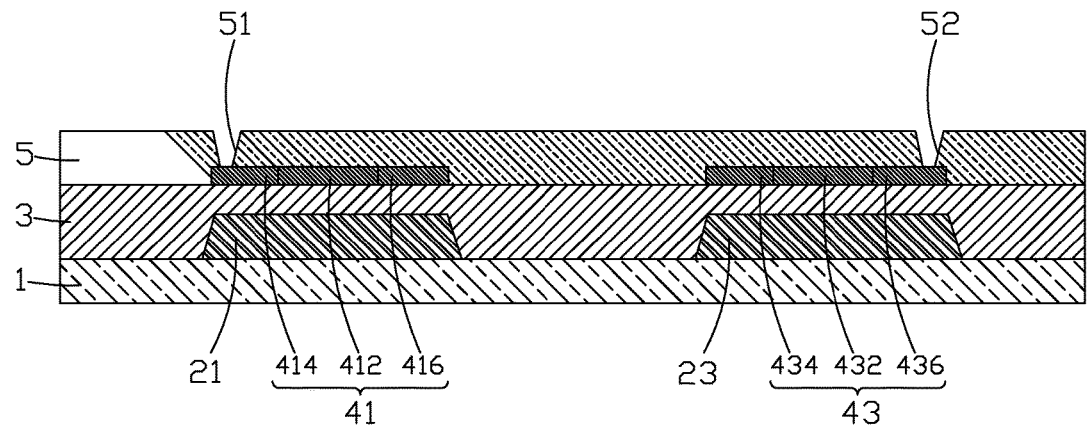
FIG. 7 is a schematic view illustrating a fourth step of the method for manufacturing the TFT substrate according to the present invention.

Step 4: as shown in FIG. 7, depositing an etch stop layer 5 on the first semiconductor layer 41, the second semiconductor layer 43, and the gate insulation layer 3 and applying a photolithographic process to form a first through hole 51 and a second through hole 52 in the etch stop layer 5 to respectively expose the first source contact zone 414 and the second drain contact zone 436.

Specifically, step 4 uses chemical vapor deposition (CVD) to deposit the etch stop layer 5.

The photolithographic process comprises operations of photoresist application, exposure, development, dry etching, and photoresist removal.

Figure 8:
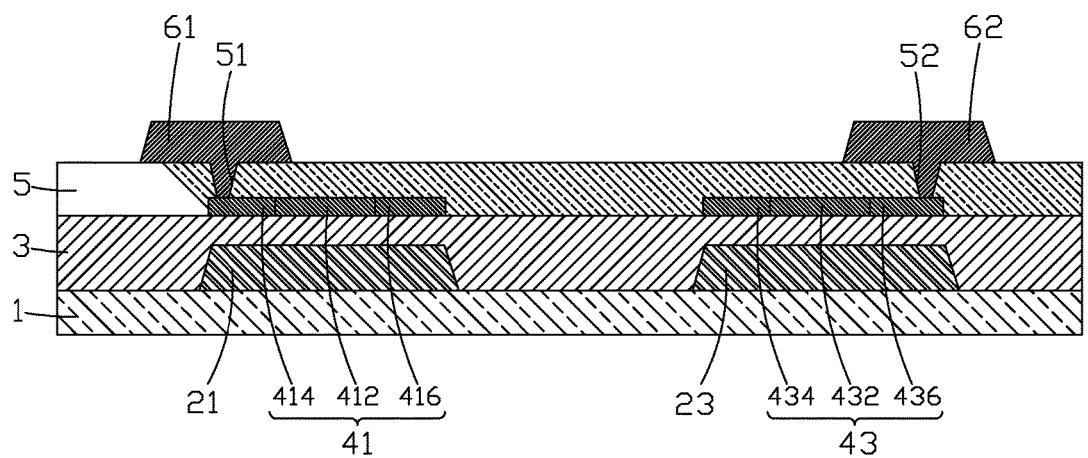
FIG. 8 is a schematic view illustrating a fifth step of the method for manufacturing the TFT substrate according to the present invention.

Step 5: as shown in FIG. 8, depositing a second metal layer on the etch stop layer 5 and applying a photolithographic process to patternize the second metal layer to form a first source terminal 61 and the second drain terminal 62 that are spaced from each other.

The first source terminal 61 is set in contact with the first source contact zone 414 via the first through hole 51; and the second drain terminal 62 is set in contact with the second drain contact zone 436 via the second through hole 52.

Specifically, step 5 uses PVD to deposit the second metal layer. Preferably, the second metal layer comprises a material of copper, aluminum, or molybdenum.

The photolithographic process comprises operations of photoresist application, exposure, development, wet etching, and photoresist removal.

Figure 9:
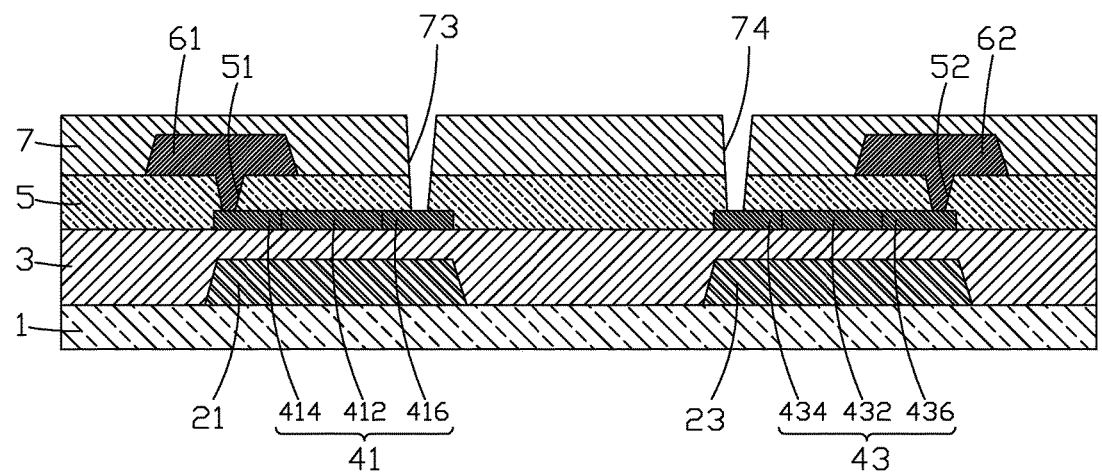
FIG. 9 is a schematic view illustrating a sixth step of the method for manufacturing the TFT substrate according to the present invention.

Step 6: as shown in FIG. 9, depositing a passivation layer 7 on the first source terminal 61, the second drain terminal 62, and the etch stop layer 5 and applying a photolithographic process to form a third through hole 73 and a fourth through hole 74 in the passivation layer 7 and the etch stop layer 5 to respectively expose the first drain contact zone 416 and the second source contact zone 434.

Specifically, step 6 uses CVD to deposit the passivation layer 7. Preferably, the passivation layer 7 comprises a material of silicon oxide or silicon nitride.

The photolithographic process comprises operations of photoresist application, exposure, development, dry etching, and photoresist removal.

Figure 10:
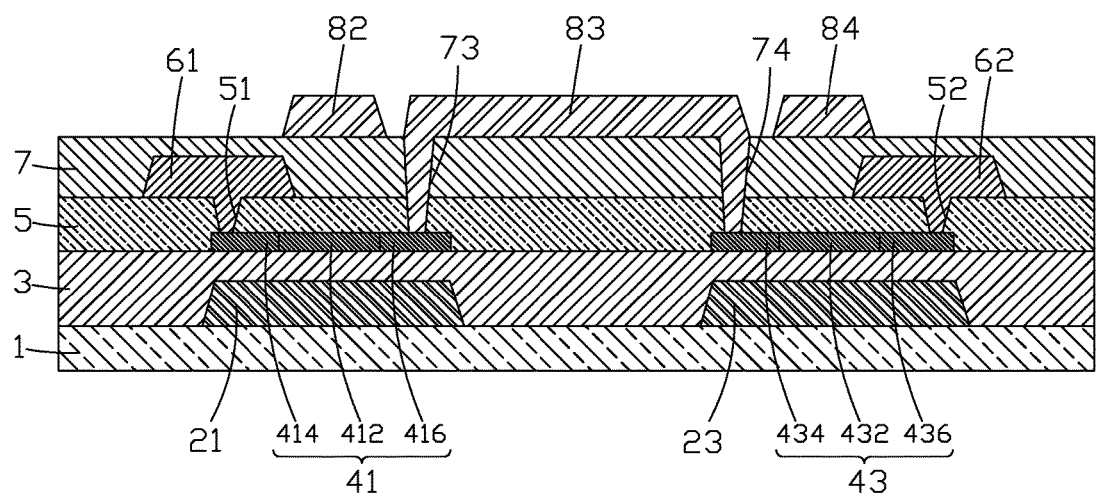
FIG. 10 is a schematic view illustrating a seventh step of the method for manufacturing the TFT substrate according to the present invention and also illustrates a cross-sectional view of the TFT substrate structure according to the present invention.

Step 7: as shown in FIG. 10, depositing a third metal layer on the passivation layer 7 and applying a photolithographic process to patternize the third metal layer to form a first top gate terminal 82, a connection electrode 83, and a second top gate terminal 84 that are spaced from each other.

The connection electrode 83 is set in contact with the first drain contact zone 416 and the second source contact zone 434 respectively through the third through hole 73 and the fourth through hole 74.

Specifically, step 7 uses PVD to deposit the third metal layer. Preferably, the third metal layer comprises a material of copper, aluminum, or molybdenum.

The photolithographic process comprises operations of photoresist application, exposure, development, wet etching, and photoresist removal.

The above-described method for manufacturing a TFT substrate arranges the first source terminal 61 and the second drain terminal 62 in the second metal layer and arranges the connection electrode 83 and the first and second top gate terminals 82, 84 in the third metal layer to prevent the design rules of a connection electrode and a second metal layer of the prior art techniques from being narrowed due to the connection electrode being collectively present on the second metal layer with signal lines of a data line and a voltage supply line so as to facilitate increase of an aperture ratio and definition of a display panel.

Figure 11:
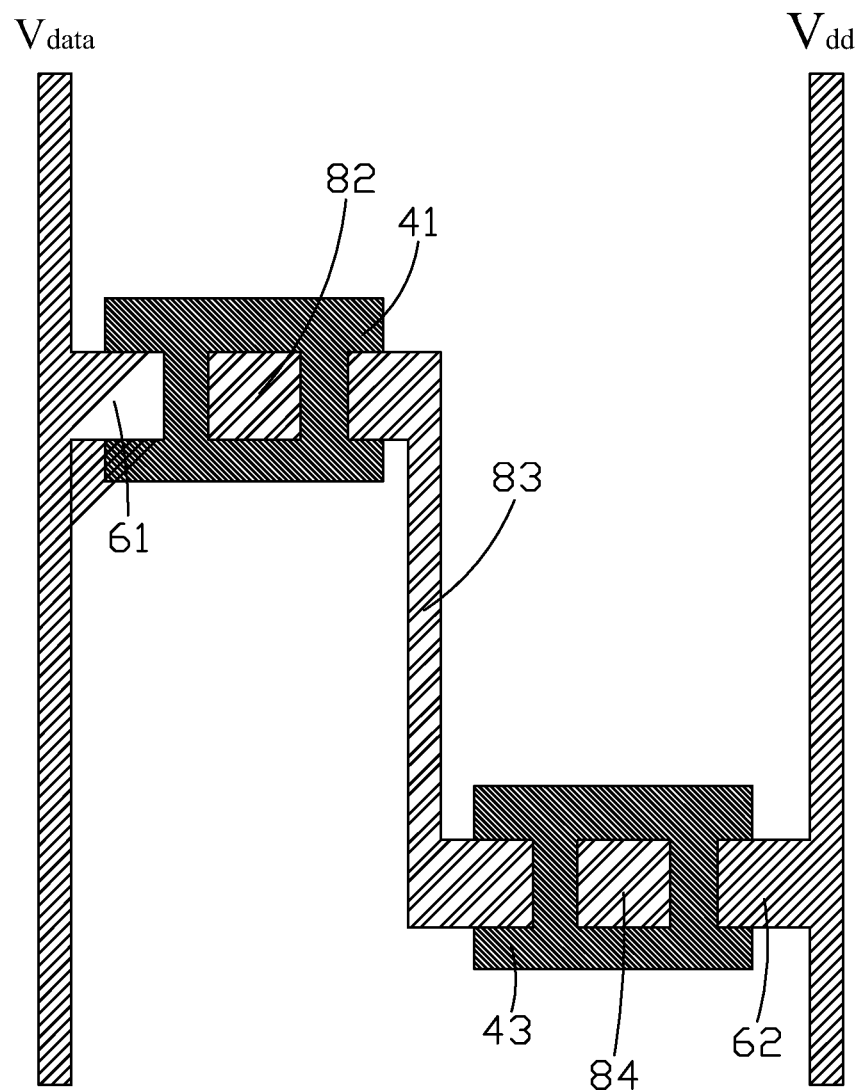
FIG. 11 is a schematic view illustrating the arrangement and connection of TFT components of the TFT substrate structure of FIG. 10 with a data line and a voltage supply line.

Referring to FIGS. 10 and 11, the present invention also provides a TFT substrate structure manufactured with the above-described method, which comprises, in sequence from bottom to top, a substrate 1, a first metal layer, a gate insulation layer 3, a semiconductor layer, an etch stop layer 5, a second metal layer, a passivation layer 7, and a third metal layer. The first metal layer comprises a first bottom gate terminal 21 and a second bottom gate terminal 23 that are spaced from each other. The semiconductor layer comprises a first semiconductor layer 41 and a second semiconductor layer 43 that are spaced from each other. The second metal layer comprises a first source terminal 61 and a second drain terminal 62 that are spaced from each other. The third metal layer comprises a first top gate terminal 82, a connection electrode 83, and a second top gate terminal 84 that are spaced from each other.

The etch stop layer 5 comprises a first through hole 51 and a second through hole 52 formed therein. The passivation layer 7 and the etch stop layer 5 comprise a third through hole 73 and a fourth through hole 74 formed therein. The first source terminal 61 is set in contact with an end of the first semiconductor layer 41 via the first through hole 51. The connection electrode 63 is set in contact with an opposite end of the first semiconductor layer 41 via the third through hole 73 and is also set in contact with an end of the second semiconductor layer 43 via the fourth through hole 74. The second drain terminal 62 is set in contact with an opposite end of the second semiconductor layer 43 via the second through hole 52.

Specifically, the first semiconductor layer 41 comprises a first channel zone 412 and a first source contact zone 414 and a first drain contact zone 416 that are respectively located on opposite sides of the first channel zone 412. The second semiconductor layer 43 comprises a second channel zone 432 and a second source contact zone 434 and a second drain contact zone 436 that are respectively located on opposite sides of the second channel zone 432;

the first through hole 51, the third through hole 27, the fourth through hole 74, and the second through hole 52 respectively expose the first source contact zone 414, the first drain contact zone 416, the second source contact zone 434, and the second drain contact zone 436;

the first source terminal 61 is set in contact with the first source contact zone 414 via the first through hole 51. The connection electrode 63 is set in contact with the first drain contact zone 416 and the second source contact zone 434 respectively through the third through hole 73 and the fourth through hole 74. The second drain terminal 62 is set in contact with the second drain contact zone 436 via the second through hole 52.

The first bottom gate terminal 21, the first semiconductor layer 41, the first source terminal 61, the connection electrode 83, and the first top gate terminal 82 constitute a first dual gate TFT. The second bottom gate terminal 23, the second semiconductor layer 44, the connection electrode 83, the second drain terminal 62, and the second top gate terminal 84 constitute a second dual gate TFT. The connection electrode 83 functions as both a first drain terminal of the first dual gate TFT and a second source terminal of the second dual gate TFT so as to have the first dual gate TFT and the second dual gate TFT connected in series with each other.

Preferably, the substrate 1 is a glass substrate.

Preferably, the first metal layer comprises a material of copper, aluminum, or molybdenum.

Preferably, the gate insulation layer 3 comprises a material of silicon oxide or silicon nitride.

Specifically, the semiconductor layer comprises a material of metal oxide. Preferably, the metal oxide is IGZO.

Preferably, the etch stop layer 5 comprises a material of silicon oxide or silicon nitride.

Preferably, the second metal layer comprises a material of copper, aluminum, or molybdenum.

Preferably, the passivation layer 7 comprises a material of silicon oxide or silicon nitride.

Preferably, the third metal layer comprises a material of copper, aluminum, or molybdenum.

In summary, the present invention provides a method for manufacturing a TFT substrate, which arranges a connection electrode that connects two dual gate TFTs in a third metal layer to prevent the design rules of a connection electrode and a second metal layer of the prior art techniques from being narrowed due to the connection electrode being collectively present on the second metal layer with signal lines of a data line and a voltage supply line so as to facilitate increase of an aperture ratio and definition of a display panel. The present invention provides a TFT substrate structure, which has a simple structure and possesses a high aperture ratio and high definition.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) substrate structure, comprising, in sequence from bottom to top, a substrate, a first metal layer, a gate insulation layer, a semiconductor layer, an etch stop layer, a second metal layer, a passivation layer, and a third metal layer, the first metal layer comprising a first bottom gate terminal and a second bottom gate terminal that are spaced from each other, the semiconductor layer comprising a first semiconductor layer and a second semiconductor layer that are spaced from each other, the second metal layer comprising a first source terminal and a second drain terminal that are spaced from each other, the third metal layer comprising a first top gate terminal, a connection electrode, and a second top gate terminal that are spaced from each other;

wherein the etch stop layer comprises a first through hole and a second through hole formed therein, the passivation layer and the etch stop layer comprising a third through hole and a fourth through hole formed therein, the first source terminal being set in contact with an end of the first semiconductor layer via the first through hole, the connection electrode being set in contact with an opposite end of the first semiconductor layer via the third through hole and also in contact with an end of the second semiconductor layer via the fourth through hole, the second drain terminal being set in contact with an opposite end of the second semiconductor layer via the second through hole; and wherein the first bottom gate terminal, the first semiconductor layer, the first source terminal, the connection electrode, and the first top gate terminal constitute a first dual gate TFT; and the second bottom gate terminal, the second semiconductor layer, the connection electrode, the second drain terminal, and the second top gate terminal constitute a second dual gate TFT, the connection electrode serving as both a first drain terminal of the first dual gate TFT and a second source terminal of the second dual gate TFT so as to have the first dual gate TFT and the second dual gate connected in series with each other;

wherein the third metal layer is separated from the second metal layer by the passivation layer and the connection electrode is formed in the third metal layer and is separated from the first source terminal and the second drain terminal that are formed in the second metal layer, such that the connection electrode that serve as the first drain terminal and the second source terminal, the first source terminal, and the second drain terminal that connect the first and second dual gate TFTs in series are respectively set in the second and third metal layers that are different from each other.

2. The TFT substrate structure as claimed in claim 1, wherein the first semiconductor layer comprises a first channel zone and a first source contact zone and a first drain contact zone that are respectively located on opposite sides of the first channel zone; and the second semiconductor layer comprises a second channel zone and a second source contact zone and a second drain contact zone that are respectively located on opposite sides of the second channel zone.

3. The TFT substrate structure as claimed in claim 2, wherein the first through hole, the third through hole, the fourth through hole, and the second through hole respectively expose the first source contact zone, the first drain contact zone, the second source contact zone, and the second drain contact zone.

4. The TFT substrate structure as claimed in claim 3, wherein the first source terminal is set in contact with the first source contact zone via the first through hole, the connection electrode being set in contact with the first drain contact zone and the second source contact zone respectively through the third through hole and the fourth through hole, the second drain terminal being set in contact with the second drain contact zone via the second through hole.

5. The TFT substrate structure as claimed in claim 1, wherein the semiconductor layer comprises a material of metal oxides.

6. A thin-film transistor (TFT) substrate structure, comprising, in sequence from bottom to top, a substrate, a first metal layer, a gate insulation layer, a semiconductor layer, an etch stop layer, a second metal layer, a passivation layer, and a third metal layer, the first metal layer comprising a first bottom gate terminal and a second bottom gate terminal that are spaced from each other, the semiconductor layer comprising a first semiconductor layer and a second semiconductor layer that are spaced from each other, the second metal layer comprising a first source terminal and a second drain terminal that are spaced from each other, the third metal layer comprising a first top gate terminal, a connection electrode, and a second top gate terminal that are spaced from each other;

wherein the etch stop layer comprises a first through hole and a second through hole formed therein, the passivation layer and the etch stop layer comprising a third through hole and a fourth through hole formed therein, the first source terminal being set in contact with an end of the first semiconductor layer via the first through hole, the connection electrode being set in contact with an opposite end of the first semiconductor layer via the third through hole and also in contact with an end of the second semiconductor layer via the fourth through hole, the second drain terminal being set in contact with an opposite end of the second semiconductor layer via the second through hole;

wherein the first bottom gate terminal, the first semiconductor layer, the first source terminal, the connection electrode, and the first top gate terminal constitute a first dual gate TFT; and the second bottom gate terminal, the second semiconductor layer, the connection electrode, the second drain terminal, and the second top gate terminal constitute a second dual gate TFT, the connection electrode serving as both a first drain terminal of the first dual gate TFT and a second source terminal of the second dual gate TFT so as to have the first dual gate TFT and the second dual gate connected in series with each other;

wherein the third metal layer is separated from the second metal layer by the passivation layer and the connection electrode is formed in the third metal layer and is separated from the first source terminal and the second drain terminal that are formed in the second metal layer, such that the connection electrode that serve as the first drain terminal and the second source terminal, the first source terminal, and the second drain terminal that connect the first and second dual gate TFTs in series are respectively set in the second and third metal layers that are different from each other;

wherein the first semiconductor layer comprises a first channel zone and a first source contact zone and a first drain contact zone that are respectively located on opposite sides of the first channel zone; and the second semiconductor layer comprises a second channel zone and a second source contact zone and a second drain contact zone that are respectively located on opposite sides of the second channel zone;

wherein the first through hole, the third through hole, the fourth through hole, and the second through hole respectively expose the first source contact zone, the first drain contact zone, the second source contact zone, and the second drain contact zone; and wherein the semiconductor layer comprises a material of metal oxides.

7. The TFT substrate structure as claimed in claim 6, wherein the first source terminal is set in contact with the first source contact zone via the first through hole, the connection electrode being set in contact with the first drain contact zone and the second source contact zone respectively through the third through hole and the fourth through hole, the second drain terminal being set in contact with the second drain contact zone via the second through hole.

* * * * *